United States Patent
Li et al.

(10) Patent No.: US 10,672,340 B2
(45) Date of Patent: Jun. 2, 2020

(54) OLED DISPLAY PANEL, METHOD FOR DRIVING THE SAME AND DISPLAY DEVICE

(71) Applicant: Shanghai Tianma AM-OLED Co., Ltd, Shanghai (CN)

(72) Inventors: Yue Li, Shanghai (CN); Dongxu Xiang, Shanghai (CN); Renyuan Zhu, Shanghai (CN); Yana Gao, Shanghai (CN); Xingyao Zhou, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 15/890,687

(22) Filed: Feb. 7, 2018

(65) Prior Publication Data
US 2018/0166017 A1    Jun. 14, 2018

(30) Foreign Application Priority Data
Oct. 26, 2017    (CN) .......................... 2017 1 1012847

(51) Int. Cl.
*G09G 3/3258*    (2016.01)
*H01L 27/32*    (2006.01)
*G09G 3/3233*    (2016.01)
*G09G 3/3266*    (2016.01)

(52) U.S. Cl.
CPC ......... *G09G 3/3258* (2013.01); *G09G 3/3233* (2013.01); *G09G 3/3266* (2013.01); *H01L 27/3244* (2013.01); *G09G 2300/0426* (2013.01); *G09G 2300/0819* (2013.01); *G09G 2300/0842* (2013.01); *G09G 2300/0861* (2013.01); *G09G 2310/0251* (2013.01); *G09G 2310/0262* (2013.01); *G09G 2310/0264* (2013.01);
(Continued)

(58) Field of Classification Search
CPC ... G09G 2300/0426; G09G 2320/0233; G09G 3/3233; G09G 3/3648; G09G 3/3258; G09G 3/3266
See application file for complete search history.

(56) References Cited

U.S. PATENT DOCUMENTS

| 2006/0244703 | A1  | 11/2006 | Choi |
|---|---|---|---|
| 2010/0156945 | A1* | 6/2010 | Yoshida ................. G02F 1/1345 345/690 |
| 2017/0178583 | A1* | 6/2017 | Zhang ................... G09G 3/3677 |

(Continued)

FOREIGN PATENT DOCUMENTS

| CN | 101154367 A | 4/2008 |
|---|---|---|
| CN | 101536064 A | 9/2009 |

(Continued)

*Primary Examiner* — Dong Hui Liang
(74) *Attorney, Agent, or Firm* — Alston & Bird LLP

(57) ABSTRACT

The present disclosure discloses an OLED display panel, a method for driving the same and a display device. A high-potential voltage and a low-potential voltage are supplied to each shift register unit through a power supply, respectively. A voltage difference between a high-potential voltage and a low-potential voltage supplied to a first shift register unit by the power supply is a first voltage difference, and a voltage difference between a high-potential voltage and a low-potential voltage supplied to a second shift register unit by the power supply is a second voltage difference. The first voltage difference differs from the second voltage difference.

17 Claims, 12 Drawing Sheets

(52) U.S. Cl.
CPC .............. *G09G 2310/0286* (2013.01); *G09G 2330/028* (2013.01); *H01L 27/326* (2013.01)

(56) References Cited

U.S. PATENT DOCUMENTS

| | | | |
|---|---|---|---|
| 2017/0352328 A1* | 12/2017 | Jeong | .................... G09G 3/3266 |
| 2018/0129106 A1* | 5/2018 | Gao | .................. G02F 1/134363 |
| 2018/0158417 A1* | 6/2018 | Xiang | .................. G09G 3/3233 |
| 2018/0166018 A1* | 6/2018 | Yang | ....................... H01L 27/32 |

FOREIGN PATENT DOCUMENTS

| | | |
|---|---|---|
| CN | 105427811 A | 3/2016 |
| CN | 107134473 A | 9/2017 |
| CN | 104820520 A | 10/2017 |

* cited by examiner

Fig.1 PROIR ART

| The power supply supplies a high-potential voltage and a low-potential voltage respectively to each of the shift register units. A voltage difference between a high-potential voltage and a low-potential voltage supplied to a first shift register unit by the power supply is a first voltage difference, and a voltage difference between a high-potential voltage and a low-potential voltage supplied to a second shift register unit by the power supply is a second voltage difference. The first voltage difference differs from the second voltage difference. | ⟵ S1101 |

| Each of the shift register units in the scan driving circuit supplies a scan signal to a corresponding row of the pixel circuits according to the received high-potential voltage and the received low-potential voltage, so that a light emitting current of the pixel circuit in the first display area is consistent with a light emitting current of the pixel circuit in the second display area when data voltages are identical. | ⟵ S1102 |

Fig.11

OLED DISPLAY PANEL, METHOD FOR DRIVING THE SAME AND DISPLAY DEVICE

CROSS-REFERENCE TO RELATED APPLICATIONS

This application claims the priority to Chinese Patent Application No. CN201711012847.1, filed on Oct. 26, 2017, the content of which is hereby incorporated by reference in its entirety.

FIELD

The present disclosure relates to the field of display technologies, particularly to an OLED display panel, a method for driving the same and a display device.

BACKGROUND

With the development of display technologies, full screens, having large screen-to-body ratios and ultra-narrow bezels, draw wide attention because of their abilities to enhance visual experience of viewers comparing with ordinary display screens. In presently existing technology, to realize functions of taking selfies, video calling and fingerprint recognition in a display device having a full screen, such as a mobile phone, a front camera, an earpiece, a fingerprint recognition area or a physical button is generally arranged on a front surface of the display device.

In an organic light emitting diode (OLED) display device, to display images in a full screen, as illustrated by FIG. 1, devices such as a camera 01 and an earpiece 02 are generally arranged in a special-shaped area A of a display panel, so that the number of pixels in each row of pixels in a first display area B1 of the display panel is greater than the number of pixels in each row of pixels in a second display area B2. The second display area B2 is an area adjacent to and on the left and right of the special-shaped area A. So loads of scan signal lines connected with each row of pixels in the first display area B1 and in the second display area B2 are different. Light emitting currents of the pixels in the first display area B1 and in the second display area B2 are thus different, causing a problem of display non-uniformity.

SUMMARY

Embodiments of the present disclosure provide an OLED display panel, a method for driving the same and a display device so as to solve a problem of display non-uniformity in the prior art.

An embodiment of the present disclosure provides an OLED display panel. The OLED display panel includes a display area and a non-display area. Pixel circuits arranged in a matrix of rows and columns are disposed in the display area. A scan driving circuit and a power supply are disposed in the non-display area. The scan driving circuit includes a plurality of first and second shift register units correspondingly connected with each row of the pixel circuits, and the shift register units are configured to supply a scan signal to corresponding rows of the pixel circuits. The display area includes a first display area and a second display area, wherein the plurality of first shift register units each is connected with a pixel circuit in the second display area. The plurality of second shift register units each is connected with a pixel circuit in the first display area. A quantity of pixel circuits in a row of pixel circuits in the second display area is fewer than a quantity of pixel circuits in a row of pixel circuits in the first display area. The power supply is configured to supply a high-potential voltage and a low-potential voltage to each shift register unit. A first voltage difference is supplied between a high-potential voltage and a low-potential voltage of one of the plurality of first shift register units by the power supply, and a second voltage difference is supplied between a high-potential voltage and a low-potential voltage of one of the plurality of second shift register units by the power supply. The first voltage difference differs from the second voltage difference.

Accordingly, an embodiment of the present disclosure further provides a display device. The display device includes an OLED display panel. The OLED display panel includes a display area and a non-display area. Pixel circuits arranged in a matrix of rows and columns are disposed in the display area. A scan driving circuit and a power supply are disposed in the non-display area. The scan driving circuit includes a plurality of first and second shift register units correspondingly connected with each row of the pixel circuits, and the shift register units are configured to supply a scan signal to corresponding rows of the pixel circuits. The display area includes a first display area and a second display area, the plurality of first shift register units each is connected with a pixel circuit in the second display area. The plurality of second shift register units each is connected with a pixel circuit in the first display area. A quantity of pixel circuits in a row of pixel circuits in the second display area is fewer than a quantity of pixel circuits in a row of pixel circuits in the first display area. And the power supply is configured to supply a high-potential voltage and a low-potential voltage to each shift register unit. a first voltage difference is supplied between a high-potential voltage and a low-potential voltage supplied to of one of the plurality of first shift register units by the power supply, and a second voltage difference is supplied between a high-potential voltage and a low-potential voltage of one of the plurality of second shift register unit by the power supply. The first voltage difference differs from the second voltage difference.

Accordingly, an embodiment of the present disclosure also provides a method for driving an OLED display panel. The OLED display panel includes a display area and a non-display area. Pixel circuits arranged in a matrix of rows and columns are disposed in the display area. A scan driving circuit and a power supply are disposed in the non-display area. The scan driving circuit includes a plurality of first and second shift register units correspondingly connected with each row of the pixel circuits. The display area includes a first display area and a second display area. The plurality of first shift register units each is connected with a pixel circuit in the second display area. The plurality of second shift register units each is connected with a pixel circuit in the second first display area. A quantity of pixel circuits in a row of pixel circuits in the second display area is fewer than a quantity of pixel circuits in a row of pixel circuits in the first display area. The method includes the following operations: 1) the power supply supplies a high-potential voltage and a low-potential voltage respectively to each of the shift register units. A first voltage difference is supplied between a high-potential voltage and a low-potential voltage of one of the plurality of first shift register units by the power supply, and a second voltage difference is supplied between a high-potential voltage and a low-potential voltage of one of the plurality of second shift register units by the power supply. The first voltage difference differs from the second voltage difference. And 2) each of the shift register units in the scan driving circuit supplies a scan signal to a corresponding row of the pixel circuits according to the received high-potential voltage and the received low-potential voltage, so that a light emitting current of the pixel circuit in the first display area is consistent with a light emitting current of the pixel circuit in the second display area when data voltages are identical.

The present disclosure has the following advantageous effects.

In an OLED display panel, a method for driving the same and a display device according to embodiments of the present disclosure, a high-potential voltage and a low-potential voltage are supplied to each shift register unit through a power supply, respectively. A voltage difference between a high-potential voltage and a low-potential voltage supplied to a first shift register unit by the power supply is a first voltage difference, and a voltage difference between a high-potential voltage and a low-potential voltage supplied to a second shift register unit by the power supply is a second voltage difference. The first voltage difference differs from the second voltage difference, so that a voltage amplitude of a scan signal received by a pixel circuit in a first display area differs from a voltage amplitude of a scan signal received by a pixel circuit in a second display area, thereby making light emitting currents of the pixel circuit in the first display area and the pixel circuit in the second display area identical when data voltages are identical, and avoiding the problem of display non-uniformity.

BRIEF DESCRIPTION OF THE DRAWINGS

FIG. 11 is a flow chart of a method for driving an OLED display panel according to an embodiment of the present disclosure.

DETAILED DESCRIPTION OF EMBODIMENTS

Figure 1:
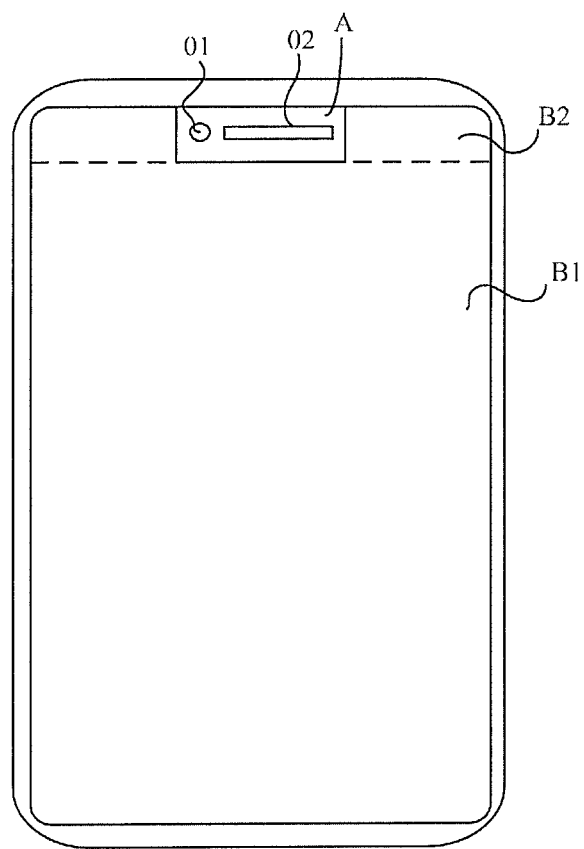
FIG. 1 is a structural schematic diagram of an existing display panel.
Figure 2:
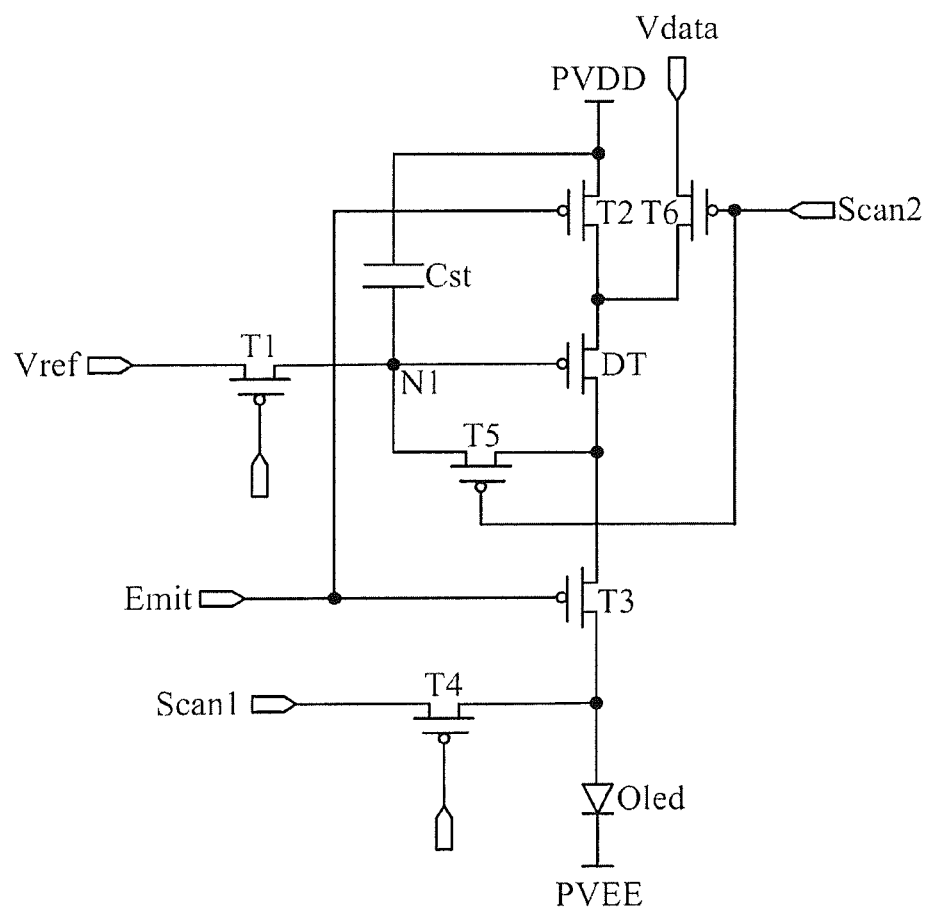
FIG. 2 is a structural schematic diagram of a pixel circuit according to an embodiment of the present disclosure.

In the display panel illustrated by FIG. 1, because the number of pixels in each row of pixels in the first display area B1 is greater than the number of the pixels in each row of pixels in the second display area B2, the loads of the scan signal lines connected with each row of pixels in the first display area B1 and in the second display area B2 are different. Take the pixel circuit illustrated by FIG. 2 as an example. When loads of scan signal lines are different, signal delays of scan signal lines Scan 2 are different, causing different speeds of charging N1 nodes by Vdata. However, the different speeds of charging the N1 nodes would result in different potentials of the N1 nodes. Because the potential of the N1 node of the pixel circuit in the first display area B1 differs from the potential of the N1 node of the pixel circuit in the second display area B2, the light emitting current generated by the pixel circuit in the first display area B1 differs from the light emitting current generated by the pixel circuit in the second display area B2, causing a problem of display non-uniformity.

Although the above-mentioned problem can be improved through capacitance compensation of the second display area, the capacitance compensation needs to occupy a large space and the space of the display panel is limited.

In view of the existing problem of display non-uniformity caused by the special-shaped area, embodiments of the present disclosure provide an OLED display panel, a method for driving the same and a display device. To make the purpose, the technical solution and the advantages of the present disclosure clearer, specific implementations of the display panel and the display device according to the embodiments of the present disclosure are described below in detail with reference to the drawings. It should be understood that the optional embodiments described below are only used for illustrating and explaining the present disclosure, not used for limiting the present disclosure. Moreover, if there is no conflict, the embodiments and features of the embodiments according to the present disclosure can be combined.

Shapes and sizes of all components in the drawings do not reflect a real ratio, and are only intended to schematically illustrate contents of the present disclosure.

Figure 4:
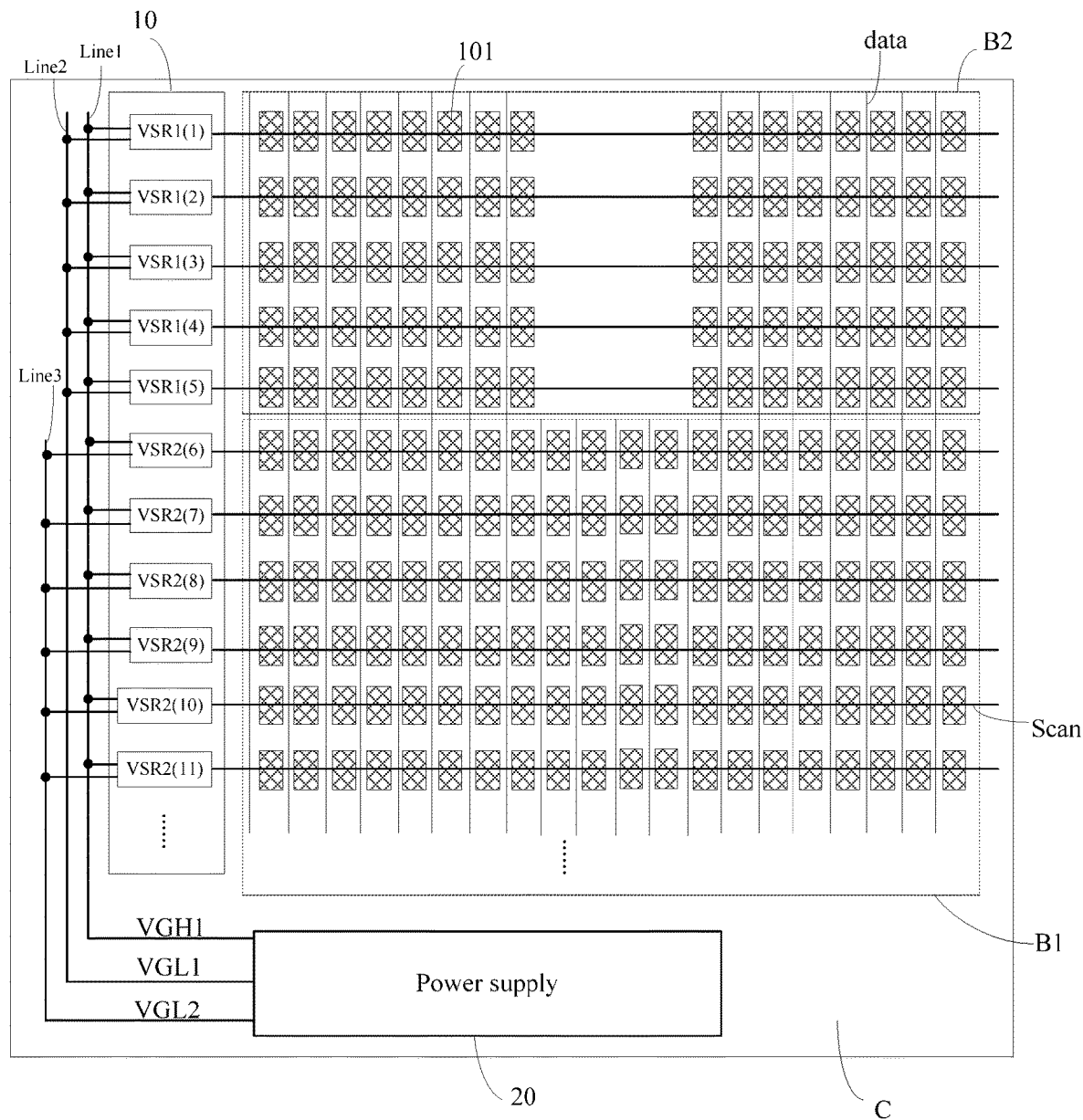
FIG. 4 is a structural schematic diagram of an OLED display panel according to an embodiment of the present disclosure.
Figure 5:
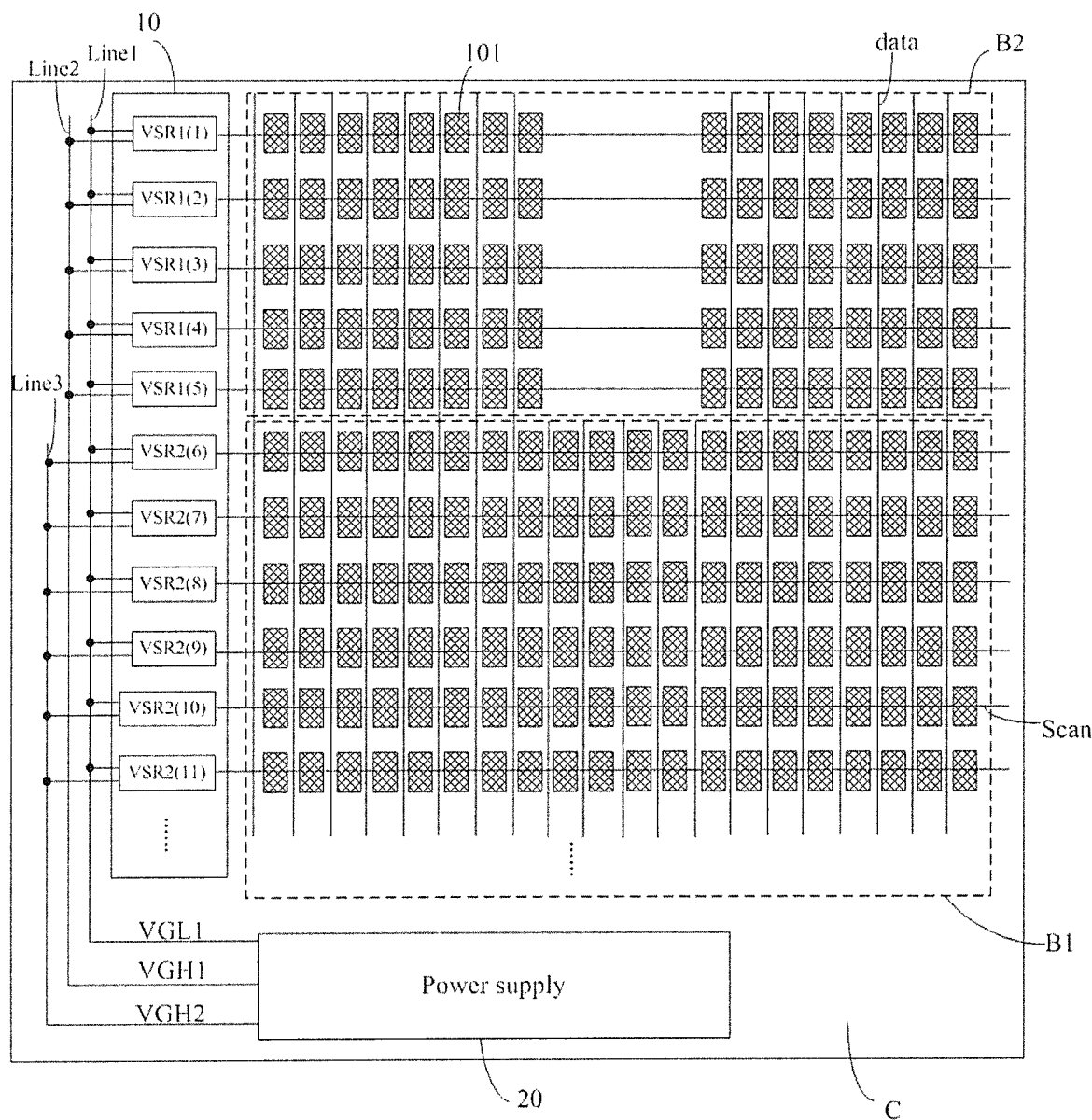
FIG. 5 is a structural schematic diagram of another OLED display panel according to an embodiment of the present disclosure.
Figure 6:
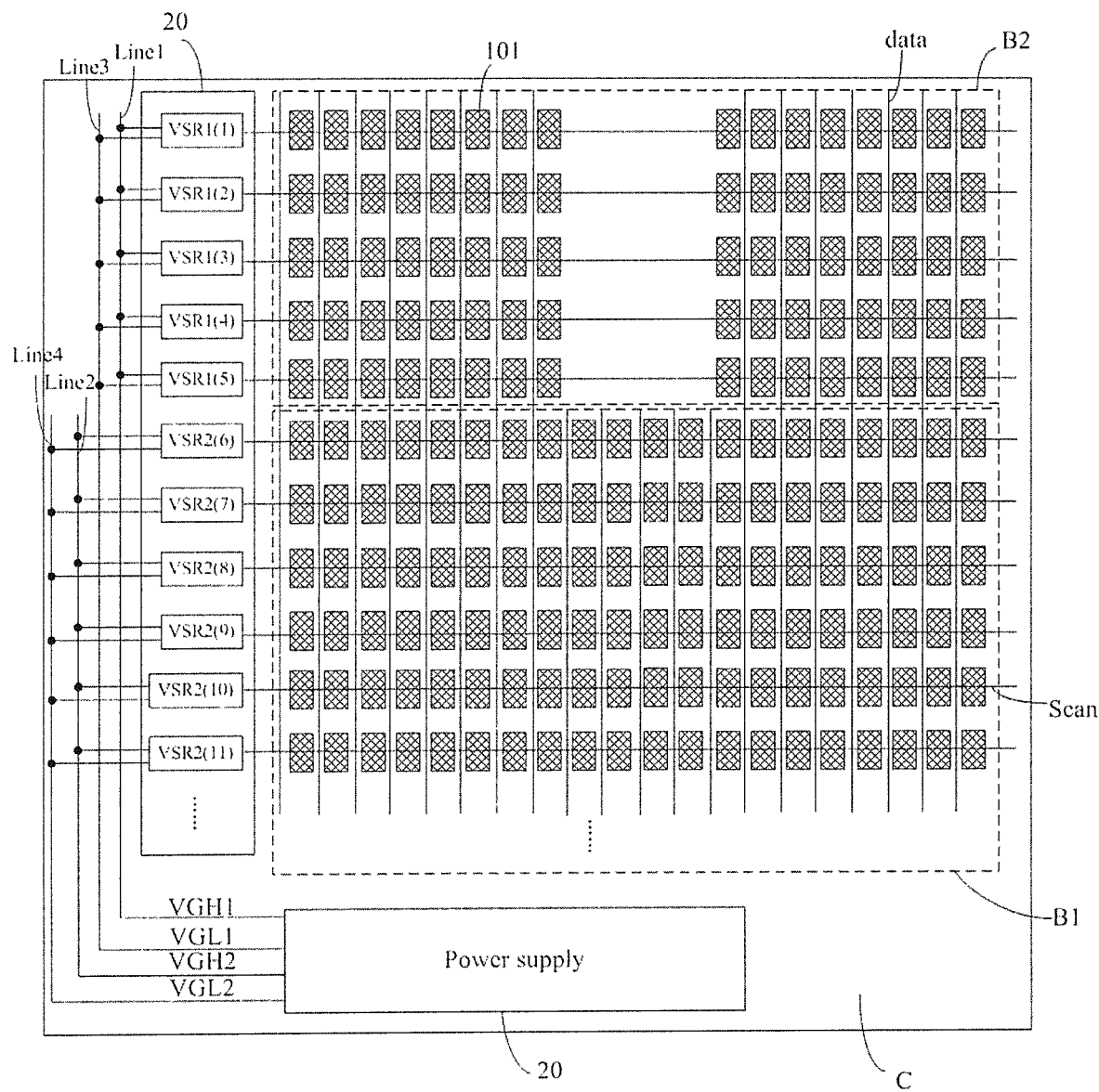
FIG. 6 is a structural schematic diagram of still another OLED display panel according to an embodiment of the present disclosure.

A display panel according to an embodiment of the present disclosure, as illustrated by any one of FIG. 4 to FIG. 6, includes display areas B1 and B2 and a non-display area C. Pixel circuits 101 arranged in matrices are disposed in the display areas B1 and B2. A scan driving circuit 10 and a power supply 20 are disposed in the non-display area C.

The scan driving circuit 10 includes shift register units VSR1 ($n$) and VSR2 ($m$) correspondingly connected with each row of the pixel circuits 101, and the shift register units are configured to supply a scan signal to corresponding rows of the pixel circuits 101. In the figures, for example, $n=1, 2, 3, 4, 5, m=6, 7, 8, 9, 10, 11, \ldots$.

The display areas B1 and B2 include a first display area B1 and a second display area B2. A shift register unit connected with a pixel circuit 101 in the second display area B2 is a first shift register unit VSR1($n$). A shift register unit connected with a pixel circuit 101 in the first display area B1 is a second shift register unit VSR2(m). The number of pixel circuits in a row of pixel circuits 101 in the second display area B2 is fewer than the number of pixel circuits in a row of pixel circuits 101 in the first display area B1.

The power supply 20 is configured to provide a high-potential voltage and a low-potential voltage to each of the shift register units VSR1(n) and VSR2(m), respectively. A voltage difference between a high-potential voltage and a low-potential voltage supplied to a first shift register unit VSR1(n) by the power supply 20 is a first voltage difference, and a voltage difference between a high-potential voltage and a low-potential voltage supplied to a second shift register unit VSR2(m) by the power supply 20 is a second voltage difference. The first voltage difference differs from the second voltage difference.

Figure 3:
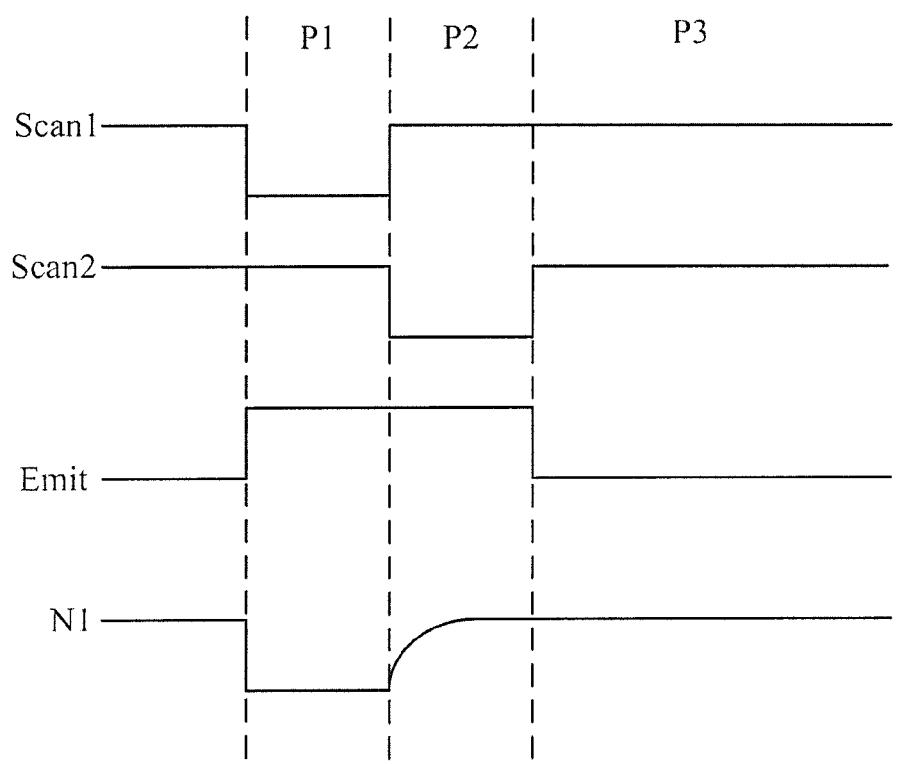
FIG. 3 is a timing diagram corresponding to the pixel circuit illustrated by FIG. 2.

The OLED display panel according to embodiments of the present disclosure is suitable for any OLED display panel having a pixel circuit. Similarly, take the pixel circuit illustrated by FIG. 2 as an example, the pixel circuit includes six switching transistors T1-T6, one capacitor Cst and one driving transistor DT. A corresponding timing diagram is illustrated by FIG. 3. In a phase P1, a potential of a node N1 is Vref. In a phase P2, the potential of the node N1 is Vdata−|Vth|+Δ V. In a phase P3, a light emitting current I=k*(PVDD−Vdata−Δ V)². ΔV=[C1/(Cst+c1)]*(VGH−VGL). C1 is parasitic capacitance of a scan signal line Scan 2 and a gate of a driving transistor DT in the display panel. VGH is a high-potential voltage on the scan signal line Scan 2 and VGL is a low-potential voltage on the scan signal line Scan 2, k is a constant and is related to channel carrier mobility, a dielectric constant of an oxide insulation layer, thickness of a gate oxide layer, a channel width and a channel length.

It can be seen from the current formula shown above that the light emitting current relates to the voltages VGH and VGL on the scan signal line. The voltages VGH and VGL on the scan signal line are provided by a shift register unit and are determined by a high-potential voltage and a low-potential voltage supplied to the shift register unit by the power supply. Therefore, inconsistency of light emitting currents caused by signal delays of scan signal lines can be compensated by adjusting VGH−VGL on the scan signal line in the first display area and VGH−VGL on the scan signal line in the second display area, i.e., by adjusting the high-potential voltages and the low-potential voltages supplied to the first shift register unit and to the second shift register unit by the power supply.

Simulation of the light emitting currents in the first display area and in the second display area shows that, when VGH=8V and VGL=−7V in the first display area and in the second display area, the light emitting current in the first display area is 7 nA and the light emitting current in the second display area is 4 nA. When VGH and VGL in the second display area are adjusted to be 6V according to brightness of the first display area, the light emitting current of the second display area becomes 6.84 nA, brightness of the second display area is almost the same as the brightness of the first display area, thereby achieving an obvious improved effect.

Therefore, in the OLED display panel according to the embodiments of the present disclosure, the high-potential voltages and the low-potential voltages are supplied to each of the shift register units through the power supply, respectively. The voltage difference between the high-potential voltage and the low-potential voltage supplied to a first shift register unit by the power supply is the first voltage difference, and the voltage difference between the high-potential voltage and the low-potential voltage supplied to a second shift register unit by the power supply is the second voltage difference. The first voltage difference differs from the second voltage difference, so that the voltage amplitude of the scan signal received by the pixel circuit in the first display area differs from the voltage amplitude of the scan signal received by the pixel circuit in the second display area, making light emitting currents of the pixel circuits in the first display area and in the second display area identical when data voltages are identical.

In the OLED display panel according to the embodiments of the present disclosure, when the data voltages in the first display area and in the second display area are identical, the brightness in the first display area and in the second display area can be detected in advance, respectively, so as to calculate a difference between the light emitting currents of the pixel circuits in the two display areas to further calculate differences between (VGH−VGL)s in the first display area and in the second display area. Namely, to determine the voltage difference between the high-potential voltage and the low-potential voltage supplied to the first shift register unit by the power supply, and the voltage difference between the high-potential voltage and the low-potential voltage supplied to the second shift register unit by the power supply, so that the gate potential of the driving transistor in the pixel circuit in the first display area is consistent with the gate potential of the driving transistor in the pixel circuit in the second display area, thereby achieving a purpose of identical light emitting currents.

In the OLED display panel according to the embodiments of the present disclosure, when the data voltages in the first display area and in the second display area are identical, the light emitting currents of the pixel circuits or the gate potentials of the driving transistors in the first display area and in the second display area can also be detected in advance, respectively, so as to determine the differences between (VGH−VGL)s in the first display area and in the second display area, which is not limited herein.

In the OLED display panel according to the embodiments of the present disclosure, the high-potential voltage supplied to the first shift register unit by the power supply is VGH1 and the low-potential voltage is VGL1; the high-potential voltage supplied to the second shift register unit by the power supply is VGH2 and the low-potential voltage is VGL2. Compared with a conventional OLED display panel, to make the light emitting currents of the pixel circuits in the first display area and in the second display area identical, VGH1−VGL1 can be adjusted, or VGH2−VGL2 can be adjusted, or VGH1−VGL1 and VGH2−VGL2 can both be adjusted, which is not limited herein.

In the OLED display panel according to the embodiments of the present disclosure, because the number of the pixel circuits in the second display area is fewer than the number of the pixel circuits in the first display area, the light emitting current in the first display area is generally taken as a standard to adjust the voltage amplitude on the scan signal line in the second display area, i.e., to adjust VGH2−VGL2, so that the light emitting current in the second display area approximates the light emitting current in the first display area.

Optionally, in an OLED display panel according to an embodiment of the present disclosure, values of the high-potential voltage VGH1 supplied to the first shift register unit by the power supply and of high-potential voltage VGH2 supplied to the second shift register unit by the power supply are identical. The value of the low-potential voltage VGL1 supplied to the first shift register unit by the power supply is different from the value of the low-potential voltage VGL2 supplied to the second shift register unit by the power supply. Namely, in the OLED display panel according to the embodiments of the present disclosure, VGH1=VGH2 but VGL1≠VGL2.

Optionally, in the OLED display panel according to the embodiment of the present disclosure, as illustrated by FIG. 4, the power supply 20 supplies the high-potential voltage VGH1 to each of the first shift register units VSR1($n$) and to each of the second shift register units VSR2($m$) through a first power supply line Line1. The power supply 20 supplies the low-potential voltage VGL1 to each of the first shift register units VSR1($n$) through a second power supply line Line2. The power supply 20 supplies the low-potential voltage VGL2 to each of the second shift register units VSR2($m$) through a third power supply line Line3.

Optionally, in the OLED display panel according to the embodiment of the present disclosure, the first power supply line, the second power supply line and the third power supply line are disposed in the same layer to be formed through one pattern composition process, thereby simplifying the fabrication process and reducing the production cost.

Optionally, in the OLED display panel according to another embodiment of the present disclosure, the value of the low-potential voltage VGL1 supplied to the first shift register unit by the power supply and the value of the low-potential voltage VGL2 supplied to the second shift register unit by the power supply are identical. The value of the high-potential voltage VGH1 supplied to the first shift register unit by the power supply is different from the value of the high-potential voltage VGH2 supplied to the second shift register unit by the power supply. Namely, in the OLED display panel according to embodiments of the present disclosure, VGL1=VGL2 and VGH1≠VGH2.

Optionally, in the OLED display panel according to the embodiment of the present disclosure, as illustrated by FIG. 5, the power supply 20 supplies the low-potential voltage VGL1 to each of the first shift register units VSR1($n$) and each of the second shift register units VSR2($m$) through a first power supply line Line1. The power supply 20 supplies the high-potential voltage VGH1 to each of the first shift register units VSR1($n$) through a second power supply line Line2. And the power supply 20 supplies the high-potential voltage VGH2 to each of the second shift register units VSR2($m$) through a third power supply line Line3.

Optionally, in the OLED display panel according to the embodiment of the present disclosure, the first power supply line, the second power supply line and the third power supply line are disposed in the same layer to be formed through one pattern composition process, thereby simplifying the fabrication process and reducing the production cost.

Optionally, in the OLED display panel according to another embodiment of the present disclosure, the value of the low-potential voltage VGL1 supplied to the first shift register unit by the power supply is different from the value of the low-potential voltage VGL2 supplied to the second shift register unit by the power supply. The value of the high-potential voltage VGH1 supplied to the first shift register unit by the power supply is different from the value of the high-potential voltage VGH2 supplied to the second shift register unit by the power supply. Namely, in the OLED display panel according to embodiments of the present disclosure, VGL1≠VGL2 and VGH1≠VGH2.

Optionally, in the OLED display panel according to the embodiment of the present disclosure, as illustrated by FIG. 6, the power supply 20 supplies the low-potential voltage VGL1 to each of the first shift register units VSR1($n$) through the first power supply line Line1. The power supply 20 supplies the low-potential voltage VGL2 to each of the second shift register units VSR2($m$) through a second power supply line Line2. The power supply 20 supplies the high-potential voltage VGH1 to each of the first shift register units VSR1($n$) through a third power supply line Line3. And the power supply 20 supplies the high-potential voltage VGH2 to each of the second shift register units VSR2($m$) through a fourth power supply line Line4.

Optionally, in the OLED display panel according to the embodiment of the present disclosure, the first power supply line, the second power supply line, the third power supply line and the fourth power supply line are disposed in the same layer to be formed through one pattern composition process, thereby simplifying the fabrication process and reducing the production cost.

Optionally, in the OLED display panel according to the embodiments of the present disclosure, the display panel further includes data lines data connected with each column of the pixel circuits. The power supply lines and the data lines data are disposed in the same layer to be formed through one pattern composition process, thereby simplifying the fabrication process and reducing the production cost.

Optionally, in the OLED display panel according to the embodiments of the present disclosure, as illustrated by any one of FIG. 4 to FIG. 6, the display panel further includes scan signal lines Scan configured to connect each row of the pixel circuits 101 with the corresponding shift register units. The shift register units are located on one end of each of the scan signal lines Scan, and the power supply 20 is located on one end of each of the data lines data.

Figure 7:
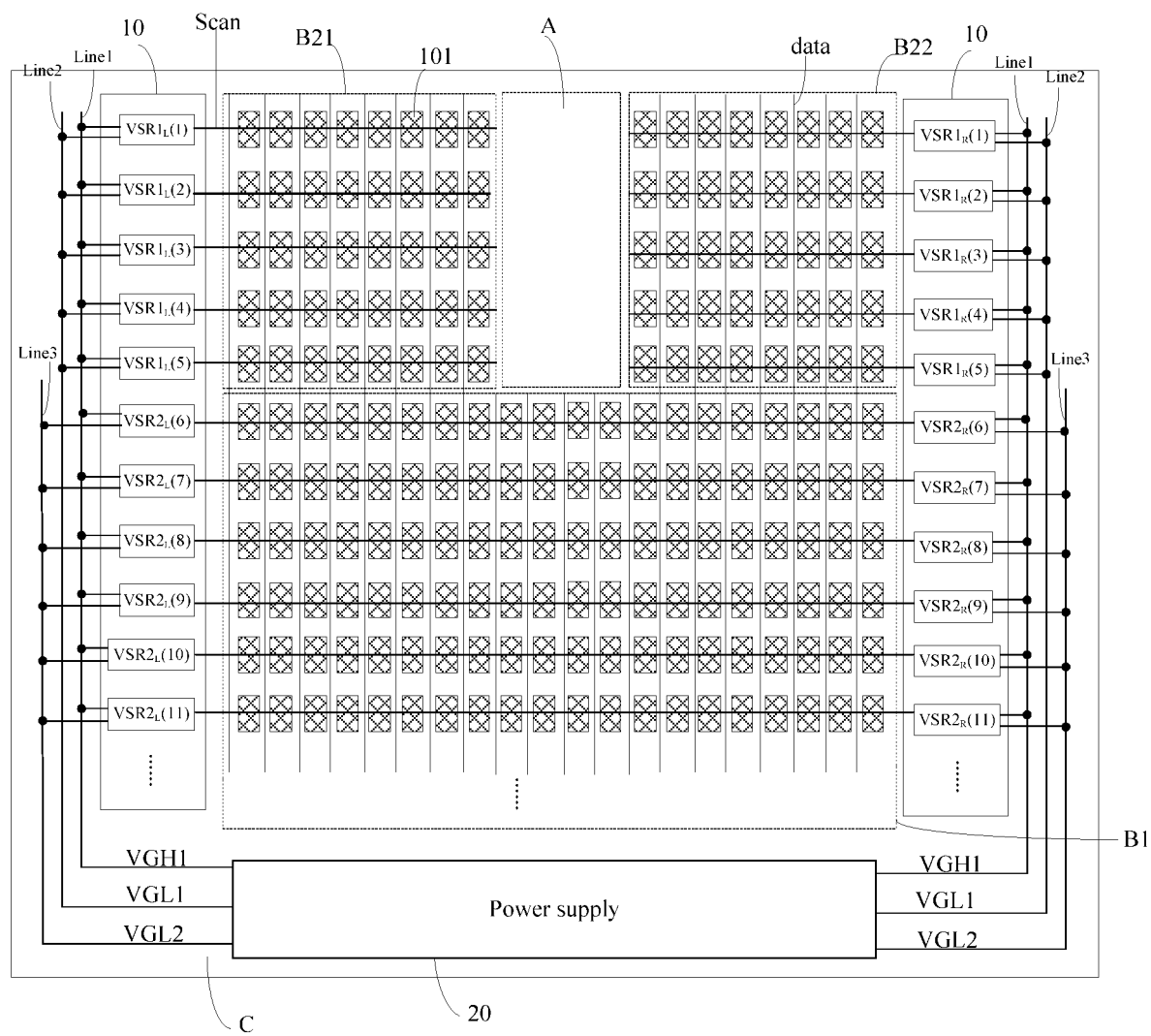
FIG. 7 is a structural schematic diagram of still another OLED display panel according to an embodiment of the present disclosure.
Figure 8:
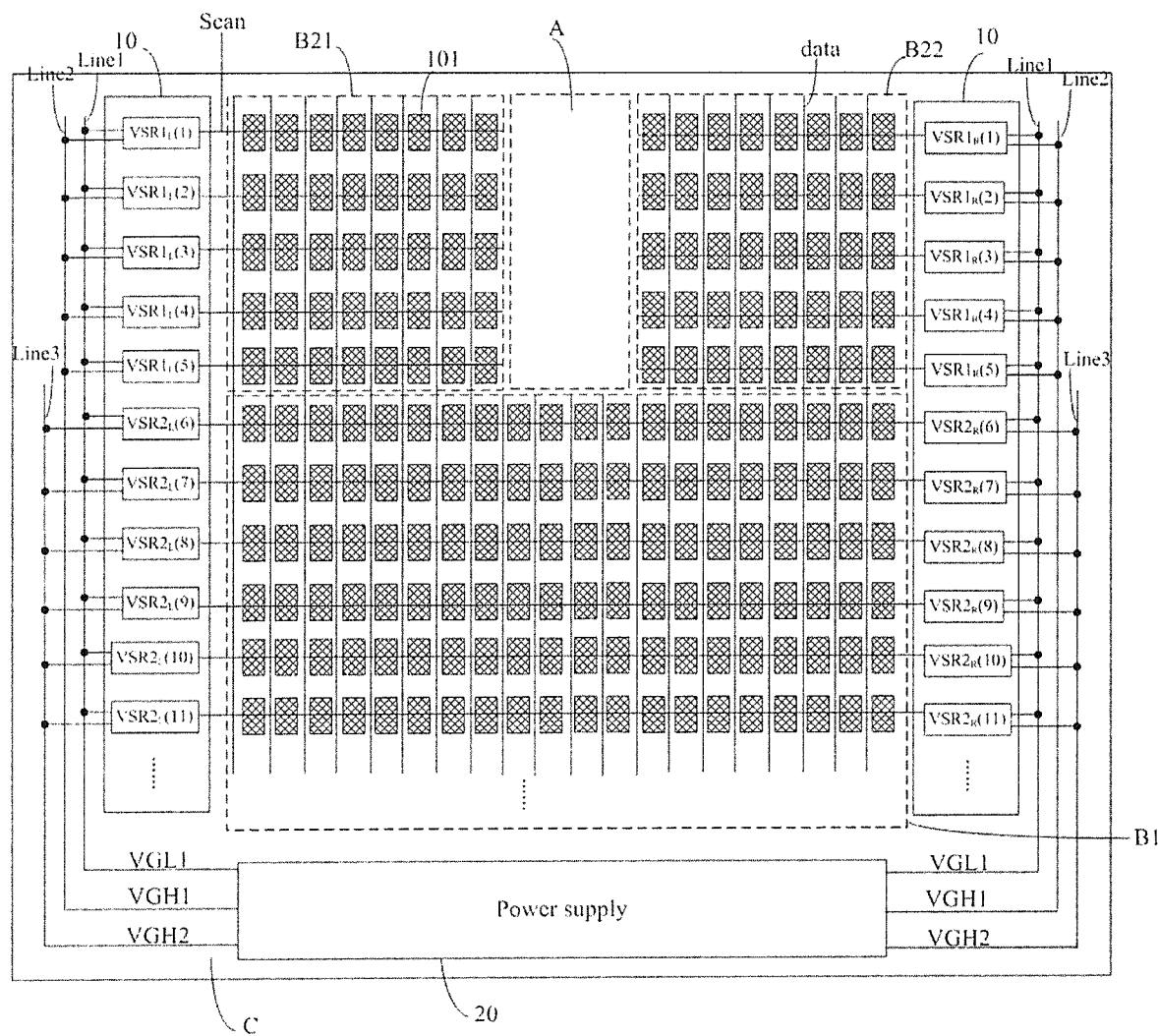
FIG. 8 is a structural schematic diagram of still another OLED display panel according to an embodiment of the present disclosure.
Figure 9:
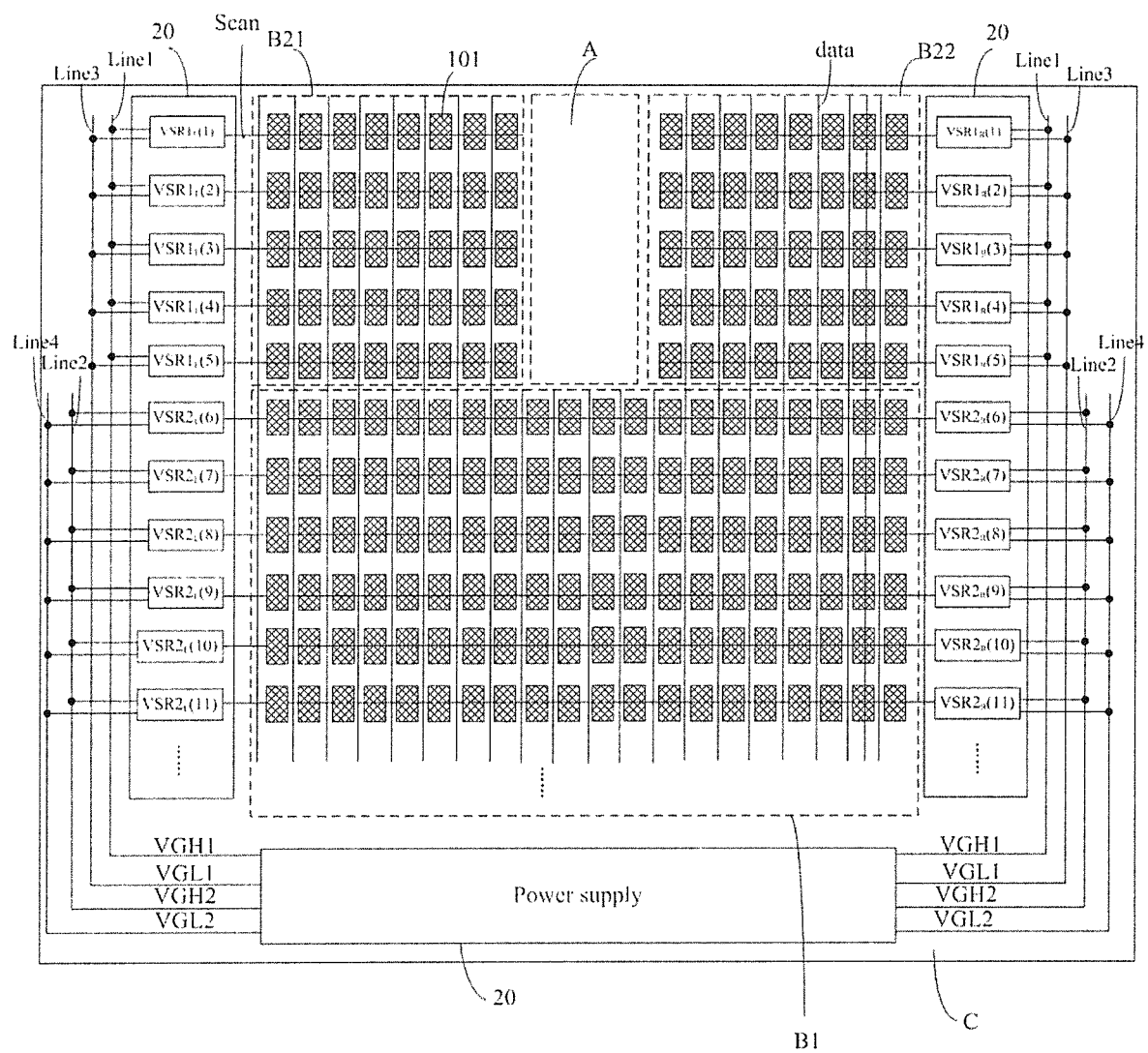
FIG. 9 is a structural schematic diagram of still another OLED display panel according to an embodiment of the present disclosure.

Optionally, in the OLED display panel according to the embodiments of the present disclosure, as illustrated by FIG. 7 to FIG. 9, the second display area B2 is located on top of or on bottom of the first display area B1, and the second display area B2 is divided into a first subarea B21 and a second subarea B22. Part of the pixel circuits 101 in each row of pixel circuits 101 in the second display area B2 are located in the first subarea B21, and the remaining part of the pixel circuits 101 are located in the second subarea B22. The display panel further includes a special-shaped area A, and the first subarea B21 and the second subarea B22 are separated by the special-shaped area A.

Optionally, in the OLED display panel according to the embodiments of the present disclosure, to realize visual aesthetics, as illustrated by FIG. 7 to FIG. 9, the first subarea B21 and the second subarea B22 are symmetrically disposed.

In the OLED display panel according to the embodiments of the present disclosure, when the first subarea and the second subarea are separated by the special-shaped area, scan signal lines connected with the same row of pixel circuits in the first subarea and in the second subarea can be connected with each other or can also be disconnected from each other, which is not limited herein.

For an OLED display panel with high resolution, the number of pixel circuits in each row of pixel circuits is large. Therefore, signal delays at the ends of the scan signal lines are serious. To avoid signal distortion at the ends of the scan signal lines, optionally, the OLED display panel according to the embodiments of the present disclosure adopts bilateral driving design. As illustrated by FIG. 7 to FIG. 9, in the first display area B1, each row of pixel circuits 101 correspond to two second shift register units VSR2L($n$) and VSR2R($n$) and the two second shift register units VSR2L($n$) and VSR2R($n$) are located at both sides of a scan signal line Scan, respectively. Each row of pixel circuits 101 in the second display area B2 also corresponds to two first shift register units $VSR1_L(n)$ and $VSR1_R(n)$, where the pixel circuits 101 belonging to the first subarea B21 are correspondingly connected with the first shift register units $VSR1_L(n)$ and the pixel circuits 101 belonging to the second subarea B22 are correspondingly connected with the first shift register units VSR1R (n).

In the OLED display panel according to the embodiments of the present disclosure, the pixel circuits are disposed over a substrate. The substrate may be a glass substrate, a flexible substrate, a silicon substrate and the like, which is not limited herein.

When the display panel is applied to the display device, devices such as a camera and an earpiece are generally arranged in the display device as well. Therefore, in order to arrange the devices such as the camera and the earpiece, during a specific implementation, in the OLED display panel according to the embodiments of the present disclosure, the special-shaped area is a hollow area of the substrate in the display panel. In a practical manufacturing process, the special-shaped area of the substrate is cut off so that the special-shaped area is a hollow area to dispose the devices such as the camera and the earpiece into the display device. Of course, it is also possible that the special-shaped area is not cut but is configured to be a transparent display area or a non-display area. Of course, specific configuration of the special-shaped area of the display panel needs to be determined according to a practical application environment of the display panel, which is not limited herein.

Figure 10A:
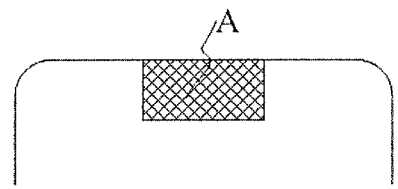
FIG. 10A is a schematic outline of a special-shaped area of an OLED display panel according to an embodiment of the present disclosure.
Figure 10B:
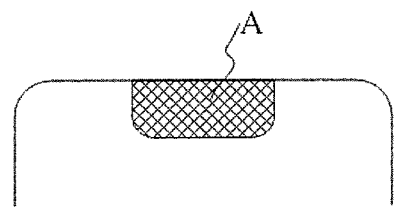
FIG. 10B is a schematic outline of a special-shaped area of another OLED display panel according to an embodiment of the present disclosure.
Figure 10C:
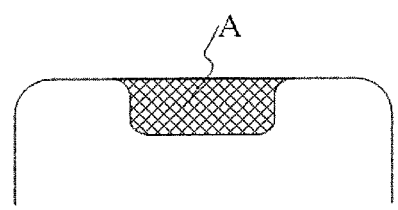
FIG. 10C is a schematic outline of a special-shaped area of another OLED display panel according to an embodiment of the present disclosure.
Figure 10D:
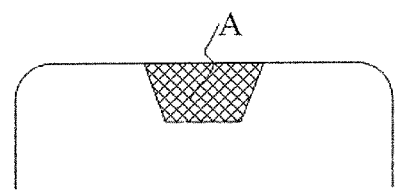
FIG. 10D is a schematic outline of a special-shaped area of another OLED display panel according to an embodiment of the present disclosure.

During a specific implementation, in the OLED display panel according to the embodiments of the present disclosure, outline of the special-shaped area can be arranged according to a shape of a device to be arranged in the special-shaped area. For example, when a plurality of devices are to be arranged in the special-shaped area A, as illustrated by FIG. 10A, the outline of the special-shaped area A can be rectangular. Or, when contours of the devices to be arranged in the special-shaped area A are irregular, as illustrated by FIG. 10B and FIG. 10C, the outline of the special-shaped area A can be non-rectangular. For example, as illustrated by FIG. 10B, only two right angles of the special-shaped area A closest to the first display area B1 are respectively arranged to be arcs. Or, as illustrated by FIG. 10C, four right angles of the special-shaped area A are respectively arranged into arcs. Or, as illustrated by FIG. 10D, the special-shaped area A can also be a trapezoid. In a practical application, the outline of the special-shaped area needs to be designed and determined according to the practical application environment of the display panel, which is not limited herein.

On the basis of the same inventive concept, an embodiment of the present disclosure also provides a method for driving any one of the above-mentioned OLED display panels. Because the principle of solving the problem by the method is similar to that by the above-mentioned OLED display panel, for implementations of the method, please refer to the implementations of the above-mentioned OLED display panel, which is not repeated again herein.

The method for driving the OLED display panel according to the embodiment of the present disclosure, as illustrated by FIG. 11, includes operations S1101 and S1102.

S1101: the power supply supplies a high-potential voltage and a low-potential voltage respectively to each of the shift register units. A voltage difference between a high-potential voltage and a low-potential voltage supplied to a first shift register unit by the power supply is a first voltage difference, and a voltage difference between a high-potential voltage and a low-potential voltage supplied to a second shift register unit by the power supply is a second voltage difference. The first voltage difference differs from the second voltage difference.

S1102: each of the shift register units in the scan driving circuit supplies a scan signal to a corresponding row of the pixel circuits according to the received high-potential voltage and the received low-potential voltage, so that a light emitting current of the pixel circuit in the first display area is consistent with a light emitting current of the pixel circuit in the second display area when data voltages are identical.

Figure 12:
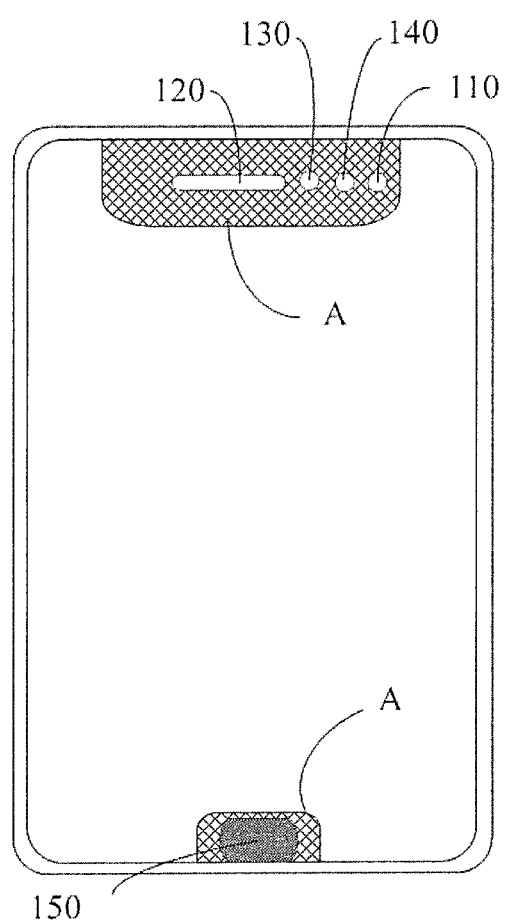
FIG. 12 is a structural schematic diagram of a display device according to an embodiment of the present disclosure.

On the basis of the same inventive concept, an embodiment of the present disclosure further provides a display device. As illustrated by FIG. 12, the display device may include any one of the above-mentioned OLED display panels according to embodiments of the present disclosure. The principle of solving the problem by the display device is similar to that by the above-mentioned OLED display panel. Therefore, for implementations of the display device, please refer to the implementations of the above-mentioned OLED display panel, which is not repeated again herein.

During a specific implementation, in the display device according to the embodiment of the present disclosure, the display device can also further include one or a combination of a camera, an earpiece, a light sensor, a distance sensor, an iris recognition sensor and a fingerprint recognition sensor disposed in the special-shaped area of the OLED display panel.

During a specific implementation, in the display device according to the embodiment of the present disclosure, as illustrated by FIG. 12 (FIG. 12 only takes a condition of including the camera, the earpiece, the light sensor, the fingerprint recognition sensor and the distance sensor as an example), the display device includes the camera 110, the earpiece 120, the light sensor 130, the distance sensor 140 and the fingerprint recognition sensor 150. Orthographic projections of the camera 110, the earpiece 120, the light sensor 130, the distance sensor 140 and the fingerprint recognition sensor 150 on the display panel are located in the special-shaped area A. Moreover, to avoid affecting work performance of the camera 110, the earpiece 120, the light sensor 130, the distance sensor 140 and the fingerprint recognition sensor 150, the special-shaped area A is generally hollow.

During a specific implementation, the display device according to the embodiment of the present disclosure may be a mobile phone as illustrated by FIG. 12. Of course, a display device according to another embodiment of the present disclosure can also be any product or component having a display function, such as a tablet, a television, a display, a laptop, a digital photo frame or a navigator. It shall be appreciated by those ordinary skilled in the art that other essential components of the display device shall be present, which are not to be repeated herein and shall not be used to limit the present disclosure.

In an OLED display panel, a method for driving the same and a display device according to embodiments of the present disclosure, a high-potential voltage and a low-potential voltage are supplied to each shift register unit through a power supply, respectively. A voltage difference between a high-potential voltage and a low-potential voltage supplied to a first shift register unit by the power supply is a first voltage difference, and a voltage difference between a high-potential voltage and a low-potential voltage supplied to a second shift register unit by the power supply is a second voltage difference. The first voltage difference differs from the second voltage difference, so that a voltage amplitude of a scan signal received by a pixel circuit in a first display area differs from a voltage amplitude of a scan signal received by a pixel circuit in a second display area, thereby making light emitting currents of the pixel circuit in the first display area and the pixel circuit in the second display area identical when data voltages are identical, and avoiding the problem of display non-uniformity.

Obviously, those skilled in the art could implement various modifications to or various variations of the present disclosure without departing from the scope of the present disclosure. So, the present disclosure is intended to include these modifications and variations if the modifications and variations of the present disclosure fall into the scope of the appended claims of the present disclosure and their equivalents.

The invention claimed is:

1. An organic light emitting diode (OLED) display panel, comprising a display area and a non-display area, wherein pixel circuits arranged in a matrix of rows and columns are disposed in the display area; a scan driving circuit and a power supply are disposed in the non-display area;
    wherein the scan driving circuit comprises a plurality of first and second shift register units correspondingly connected with each row of the pixel circuits, and the shift register units are configured to supply a scan signal to corresponding rows of the pixel circuits;
    wherein the display area comprises a first display area and a second display area, wherein the plurality of first shift register units each is connected with a pixel circuit in the second display area; the plurality of second shift register units each is connected with a pixel circuit in the first display area; a quantity of pixel circuits in a row of pixel circuits in the second display area is fewer than a quantity of pixel circuits in a row of pixel circuits in the first display area; and
    wherein the power supply is configured to supply a high-potential voltage and a low-potential voltage to each shift register unit; wherein a first voltage difference is supplied between a high-potential voltage and a low-potential voltage of one of the plurality of first shift register units by the power supply, and a second voltage difference is supplied between a high-potential voltage and a low-potential voltage of one of the plurality of second shift register units by the power supply; wherein the first voltage difference differs from the second voltage difference.

2. The OLED display panel according to claim 1, wherein a value of the high-potential voltage supplied to the first shift register unit by the power supply is the same as a value of the high-potential voltage supplied to the second shift register unit by the power supply; and
    a value of the low-potential voltage supplied to the first shift register unit by the power supply is different from a value of the low-potential voltage supplied to the second shift register unit by the power supply.

3. The OLED display panel according to claim 2, wherein the power supply supplies the high-potential voltage to each of the plurality of first shift register units and to each of the plurality of second shift register units through a first power supply line;
    wherein the power supply supplies the low-potential voltage to each of the plurality of first shift register units through a second power supply line; and
    wherein the power supply supplies the low-potential voltage to each of the plurality of second shift register units through a third power supply line.

4. The OLED display panel according to claim 3, wherein the first power supply line, the second power supply line and the third power supply line are disposed in a same layer.

5. The OLED display panel according to claim 4, wherein the display panel further comprises data lines connected with each column of the pixel circuits; and
    each of the power supply lines and the data lines are disposed in a same layer.

6. The OLED display panel according to claim 1, wherein a value of the low-potential voltage supplied to the first shift register unit by the power supply is the same as a value of the low-potential voltage supplied to the second shift register unit by the power supply; and
    a value of the high-potential voltage supplied to the first shift register unit by the power supply is different from a value of the high-potential voltage supplied to the second shift register unit by the power supply.

7. The OLED display panel according to claim 6, wherein the power supply supplies the low-potential voltage to each of the plurality of first shift register units and to each of the plurality of second shift register units through a first power supply line;
    the power supply supplies the high-potential voltage to each of the plurality of first shift register units through a second power supply line; and
    the power supply supplies the high-potential voltage to each of the plurality of second shift register units through a third power supply line.

8. The OLED display panel according to claim 7, wherein the first power supply line, the second power supply line and the third power supply line are disposed in a same layer.

9. The OLED display panel according to claim 8, wherein the display panel further comprises data lines connected with each column of the pixel circuits; and
    each of the power supply lines and the data lines are disposed in a same layer.

10. The OLED display panel according to claim 1, wherein a value of the low-potential voltage supplied to the first shift register unit by the power supply is different from a value of the low-potential voltage supplied to the second shift register unit by the power supply; and
    a value of the high-potential voltage supplied to the first shift register unit by the power supply is different from a value of the high-potential voltage supplied to the second shift register unit by the power supply.

11. The OLED display panel according to claim 10, wherein the power supply supplies the low-potential voltage to each of the plurality of first shift register units through a first power supply line;
    the power supply supplies the low-potential voltage to each of the plurality of second shift register units through a second power supply line;
    the power supply supplies the high-potential voltage to each of the plurality of first shift register units through a third power supply line; and
    the power supply supplies the high-potential voltage to each of the plurality of second shift register units through a fourth power supply line.

12. The OLED display panel according to claim 11, wherein the first power supply line, the second power supply line, the third power supply line and the fourth power supply line are disposed in a same layer.

13. The OLED display panel according to claim 12, wherein the display panel further comprises data lines connected with each column of the pixel circuits; and
    each of the power supply lines and the data lines are disposed in a same layer.

14. The OLED display panel according to claim 1, wherein the second display area is located on top or bottom of the first display area, and the second display area is divided into a first subarea and a second subarea, wherein part of the pixel circuits in each row of the pixel circuits in the second display area are located in the first subarea, and the remaining part of pixel circuits are located in the second subarea; and the display panel further comprises a special-shaped area; and the first subarea and the second subarea are separated by the special-shaped area.

15. The OLED display panel according to claim 14, wherein the first subarea and the second subarea are symmetrically disposed.

16. A display device, comprising an organic light emitting diode (OLED) display panel, wherein the OLED display panel comprises a display area and a non-display area, pixel circuits arranged in a matrix of rows and columns are disposed in the display area; a scan driving circuit and a power supply are disposed in the non-display area;

wherein the scan driving circuit comprises a plurality of first and second shift register units correspondingly connected with each row of the pixel circuits, and the shift register units are configured to supply a scan signal to corresponding rows of the pixel circuits;

wherein the display area comprises a first display area and a second display area, wherein the plurality of first shift register units each is connected with a pixel circuit in the second display area; the plurality of second shift register units each is connected with a pixel circuit in the first display area; a quantity of pixel circuits in a row of pixel circuits in the second display area is fewer than a quantity of pixel circuits in a row of pixel circuits in the first display area; and wherein the power supply is configured to supply a high-potential voltage and a low-potential voltage to each shift register unit; wherein a first voltage difference is supplied between a high-potential voltage and a low-potential voltage of one of the plurality of first shift register units by the power supply, and a second voltage difference is supplied between a high-potential voltage and a low-potential voltage of one of the plurality of second shift register unit by the power supply; wherein the first voltage difference differs from the second voltage difference.

17. A method for driving an organic light emitting diode (OLED) display panel, wherein the OLED display panel comprises a display area and a non-display area, pixel circuits arranged in a matrix of rows and columns are disposed in the display area; wherein a scan driving circuit and a power supply are disposed in the non-display area; the scan driving circuit comprises a plurality of first and second shift register units correspondingly connected with each row of the pixel circuits; wherein the display area comprises a first display area and a second display area; wherein the plurality of first shift register units each is connected with a pixel circuit in the second display area; the plurality of second shift register units each is connected with a pixel circuit in the first display area; wherein a quantity of pixel circuits in a row of pixel circuits in the second display area is fewer than a quantity of pixel circuits in a row of pixel circuits in the first display area;

wherein the method comprises:

supplying a high-potential voltage and a low-potential voltage respectively to each of the shift register units, wherein a first voltage difference is supplied between a high-potential voltage and a low-potential voltage of one of the plurality of first shift register units by the power supply, and a second voltage difference is supplied between a high-potential voltage and a low-potential voltage of one of the plurality of second shift register units by the power supply, wherein the first voltage difference differs from the second voltage difference; and supplying a scan signal to a corresponding row of the pixel circuits by each of the shift register units in the scan driving circuit supplies according to the received high-potential voltage and the received low-potential voltage, so that a light emitting current of the pixel circuit in the first display area is consistent with a light emitting current of the pixel circuit in the second display area when data voltages are identical.

\* \* \* \* \*